(12) United States Patent
Chen et al.

(10) Patent No.: US 11,676,939 B2
(45) Date of Patent: Jun. 13, 2023

(54) DISCRETE POLYMER IN FAN-OUT PACKAGES

(71) Applicant: Taiwan Semiconductor Manufacturing Co., Ltd., Hsinchu (TW)

(72) Inventors: Hsien-Wei Chen, Hsinchu (TW); Jie Chen, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 58 days.

(21) Appl. No.: 17/140,835

(22) Filed: Jan. 4, 2021

(65) Prior Publication Data

US 2021/0125963 A1 Apr. 29, 2021

Related U.S. Application Data

(60) Continuation of application No. 16/915,425, filed on Jun. 29, 2020, now Pat. No. 11,145,622, which is a
(Continued)

(51) Int. Cl.
*H01L 25/065* (2023.01)
*H01L 23/538* (2006.01)
(Continued)

(52) U.S. Cl.
CPC ........ *H01L 25/0652* (2013.01); *H01L 21/486* (2013.01); *H01L 21/4853* (2013.01); *H01L 21/4857* (2013.01); *H01L 21/561* (2013.01); *H01L 21/565* (2013.01); *H01L 21/76802* (2013.01); *H01L 21/76831* (2013.01); *H01L 21/78* (2013.01); *H01L 23/3114* (2013.01); *H01L 23/3135* (2013.01);
(Continued)

(58) Field of Classification Search
CPC ............ H01L 25/0652; H01L 21/4853; H01L 21/4857; H01L 21/486; H01L 21/561; H01L 21/565; H01L 21/76831; H01L 21/76802; H01L 21/78; H01L 23/311
See application file for complete search history.

(56) References Cited

U.S. PATENT DOCUMENTS 7,858,440 B2 12/2010 Pressel et al.
8,004,072 B2 8/2011 Hedler et al.
(Continued)

FOREIGN PATENT DOCUMENTS

CN 101393873 A 3/2009
CN 102136433 A 7/2011
(Continued)

*Primary Examiner* — Jasmine J Clark
(74) *Attorney, Agent, or Firm* — Slater Matsil, LLP

(57) ABSTRACT

A package includes a first molding material, a lower-level device die in the first molding material, a dielectric layer over the lower-level device die and the first molding material, and a plurality of redistribution lines extending into the first dielectric layer to electrically couple to the lower-level device die. The package further includes an upper-level device die over the dielectric layer, and a second molding material molding the upper-level device die therein. A bottom surface of a portion of the second molding material contacts a top surface of the first molding material.

20 Claims, 22 Drawing Sheets

Related U.S. Application Data continuation of application No. 16/390,454, filed on Apr. 22, 2019, now Pat. No. 10,700,040, which is a continuation of application No. 15/830,458, filed on Dec. 4, 2017, now Pat. No. 10,269,764, which is a continuation of application No. 15/431,192, filed on Feb. 13, 2017, now Pat. No. 9,837,379, which is a division of application No. 14/690,081, filed on Apr. 17, 2015, now Pat. No. 9,666,502.

(51) Int. Cl.

| | | |
|---|---|---|
| *H01L 21/78* | (2006.01) | |
| *H01L 21/56* | (2006.01) | |
| *H01L 21/768* | (2006.01) | |
| *H01L 23/31* | (2006.01) | |
| *H01L 23/00* | (2006.01) | |
| *H01L 21/48* | (2006.01) | |
| *H01L 25/00* | (2006.01) | |

(52) U.S. Cl.
CPC ...... *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 24/97* (2013.01); *H01L 25/50* (2013.01); *H01L 21/568* (2013.01); *H01L 2224/04105* (2013.01); *H01L 2224/12105* (2013.01); *H01L 2224/19* (2013.01); *H01L 2224/32225* (2013.01); *H01L 2224/73267* (2013.01); *H01L 2224/83005* (2013.01); *H01L 2224/92244* (2013.01); *H01L 2224/97* (2013.01); *H01L 2225/06517* (2013.01); *H01L 2225/06548* (2013.01); *H01L 2225/06555* (2013.01); *H01L 2225/06572* (2013.01); *H01L 2225/06582* (2013.01); *H01L 2924/18162* (2013.01)

(56) References Cited

U.S. PATENT DOCUMENTS

| | | | |
|---|---|---|---|
| 8,264,849 | B2 | 9/2012 | Guzek |
| 8,361,842 | B2 | 1/2013 | Yu et al. |
| 8,372,689 | B2 | 2/2013 | Lee et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,779,601 | B2 | 7/2014 | Gan et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,829,676 | B2 | 9/2014 | Yu et al. |
| 8,871,568 | B2 | 10/2014 | Shih et al. |
| 8,877,554 | B2 | 11/2014 | Tsai et al. |
| 8,975,741 | B2 | 3/2015 | Lin et al. |
| 2007/0262435 | A1 | 11/2007 | Lam |
| 2008/0197469 | A1* | 8/2008 | Yang ............... H01L 25/0657 438/118 |
| 2009/0079090 | A1 | 3/2009 | Pressel et al. |
| 2011/0177654 | A1 | 7/2011 | Lee et al. |
| 2011/0291288 | A1 | 12/2011 | Wu et al. |
| 2011/0298119 | A1 | 12/2011 | Cho et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0168874 | A1 | 7/2013 | Scanlan |
| 2013/0307140 | A1 | 11/2013 | Huang et al. |
| 2014/0015131 | A1 | 1/2014 | Meyer et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0264946 | A1 | 9/2014 | Kim et al. |
| 2014/0353823 | A1 | 12/2014 | Park et al. |
| 2015/0187710 | A1 | 7/2015 | Scanlan et al. |
| 2015/0187722 | A1 | 7/2015 | Chiang et al. |

FOREIGN PATENT DOCUMENTS

| | | |
|---|---|---|
| CN | 102201382 A | 9/2011 |
| CN | 103199055 A | 7/2013 |
| KR | 20130077031 A | 7/2013 |

* cited by examiner

DISCRETE POLYMER IN FAN-OUT PACKAGES

PRIORITY CLAIM AND CROSS-REFERENCE

This application is a continuation of U.S. patent application Ser. No. 16/915,425, entitled "Discrete Polymer in Fan-Out Packages," filed on Jun. 29, 2020, now U.S. Pat. No. 11,145,622 issued on Oct. 12, 2021, which is a continuation of U.S. patent application Ser. No. 14/390,454, entitled "Discrete Polymer in Fan-Out Packages," filed on Apr. 22, 2019, now U.S. Pat. No. 10,700,040 issued Jun. 30, 2020, which is a continuation of U.S. patent application Ser. No. 15/830,458, entitled "Discrete Polymer in Fan-Out Packages," filed on Dec. 4, 2017, now U.S. Pat. No. 10,269,764 issued Apr. 23, 2019, which is a continuation of U.S. patent application Ser. No. 15/431,192, entitled "Discrete Polymer in Fan-Out Packages," filed on Feb. 13, 2017, now U.S. Pat. No. 9,837,379 issued Dec. 5, 2017, which is a divisional of U.S. patent application Ser. No. 14/690,081, entitled "Discrete Polymer in Fan-Out Packages," filed on Apr. 17, 2015, now U.S. Pat. No. 9,666,502 issued May 30, 2017, which applications are incorporated herein by reference.

BACKGROUND

With the evolving of semiconductor technologies, semiconductor dies are becoming increasingly smaller. More functions, however, need to be integrated into the semiconductor dies. Accordingly, the semiconductor dies need to have increasingly greater numbers of Input/output (I/O) pads packaged into smaller areas, and the density of the I/O pads rises quickly. As a result, the packaging of the semiconductor dies becomes more difficult, and adversely affecting the yield.

Package technologies can be divided into two categories. One category is typically referred to as Wafer Level Package (WLP), wherein the dies on a wafer are packaged before they are sawed. The WLP technology has some advantageous features, such as a greater throughput and a lower cost. Further, less underfill or molding compound is needed. However, the WLP technology suffers from drawbacks. The conventional WLP can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridging may occur. Additionally, under the fixed ball-size requirement, solder balls must have a certain size, which in turn limits the number of solder balls that can be packed on the surface of a die.

In the other category of packaging, dies are sawed from wafers before they are packaged onto other wafers, and only "known-good-dies" are packaged. An advantageous feature of this packaging technology is the possibility of forming fan-out packages, which means the I/O pads on a die can be redistributed to a greater area than the die itself, and hence the number of I/O pads packed on the surfaces of the dies can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
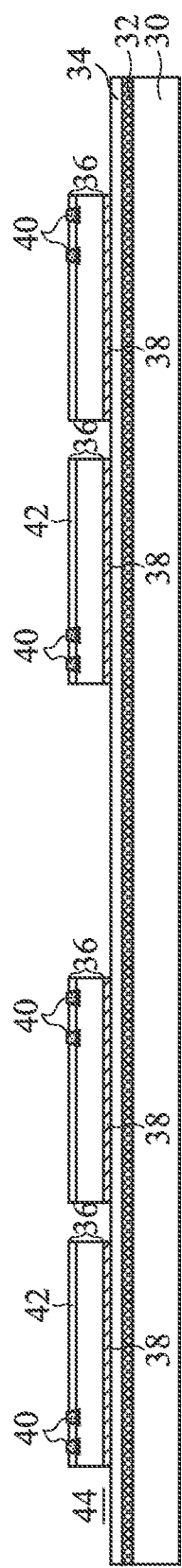
FIGS. 1 through 11 illustrate the cross-sectional views of intermediate stages in the formation of a multi-stacking fan-out package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A multi-stacking fan-out packages and the method of forming the same are provided in accordance with various exemplary embodiments. The intermediate stages of forming the multi-stacking fan-out packages are illustrated. The variations of the embodiments are discussed. Throughout the various views and illustrative embodiments, like reference numbers are used to designate like elements.

FIGS. 1 through 11 illustrate the cross-sectional views of intermediate stages in the formation of a multi-stacking fan-out package in accordance with some embodiments of the present disclosure. In the subsequent discussion, the process steps shown in FIGS. 1 through 11 are discussed referring to the process steps in FIG. 12.

Referring to FIG. 1, carrier 30 is provided, and adhesive layer 32 is disposed over carrier 30. Carrier 30 may be a blank glass carrier, a blank ceramic carrier, or the like, and may have a shape of a semiconductor wafer with a round top-view shape. Carrier 30 is sometimes referred to as a carrier wafer. Adhesive layer 32 may be formed of a Light-to-Heat Conversion (LTHC) material, for example, and other types of adhesives may also be used. In accordance with some embodiments of the present disclosure, adhesive layer 32 is capable of decomposing under the heat of light, and hence can release carrier 30 from the structure formed thereon.

Buffer layer 34 is formed over adhesive layer 32. In accordance with some embodiments of the present disclosure, buffer layer 34 is a polymer layer formed of polybenzoxazole (PBO), polyimide, or the like.

Figure 22:
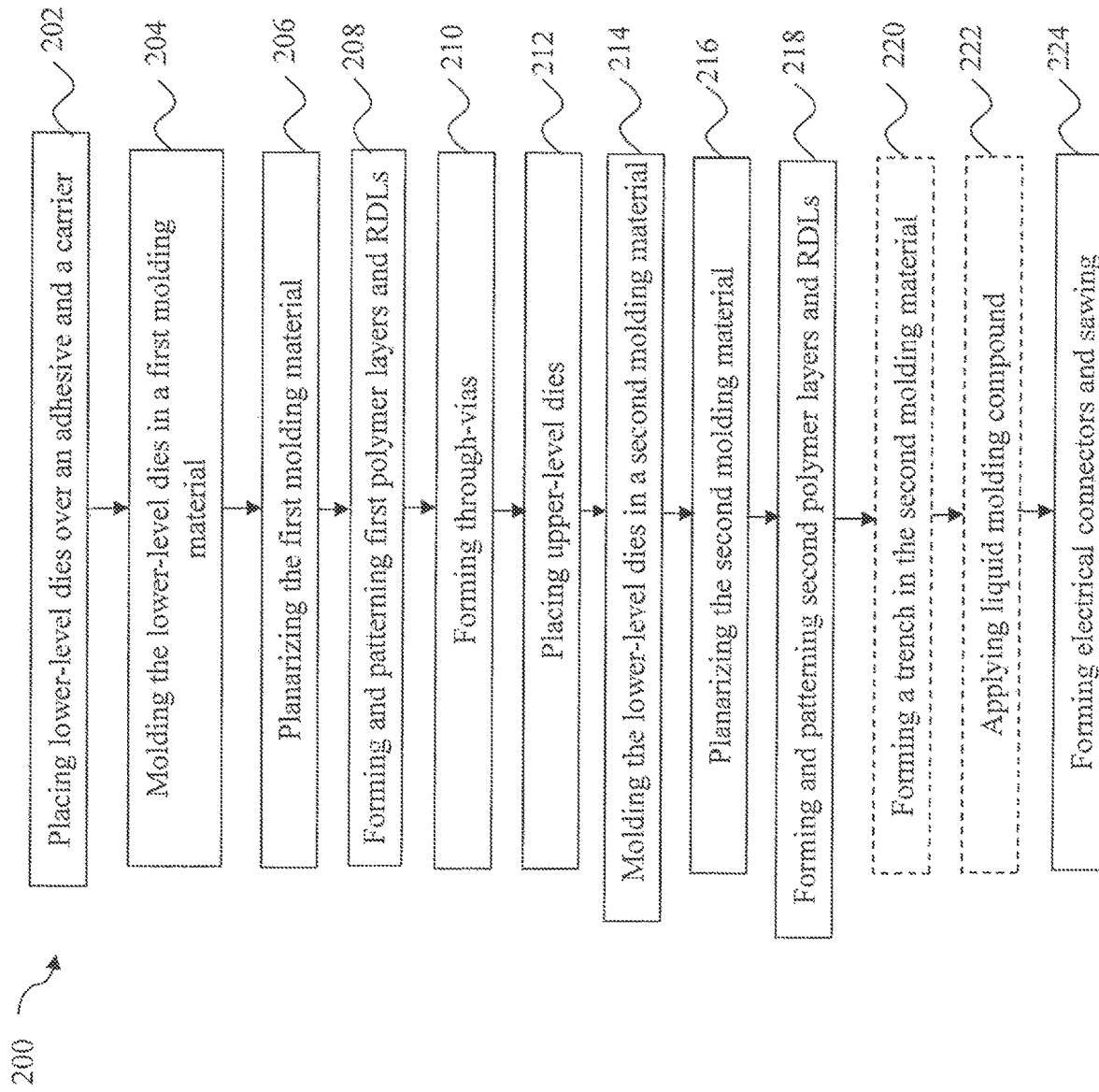
FIG. 22 illustrates a process flow for forming a multi-stacking fan-out package in accordance with some embodiments.

Device dies 36 are placed over buffer layer 34. The respective step is shown as step 202 in the process flow shown in FIG. 22. Device dies 36 may be adhered to buffer layer 34 through die attach films 38. The edges of die attach films 38 are co-terminus with (aligned to) the edges of the respective overlaying device dies 36. Die attach films 38 are adhesive films. The plurality of placed device dies 36 may be arranged as an array including a plurality of rows and a plurality of columns. Device dies 36 may include a semiconductor substrate having a back surface (the surface facing down) in contact with the respective die attach films 38. Device dies 36 further include integrated circuit devices (such as active devices, which include transistors, for example, not shown) at the front surfaces (the surface facing up) of the semiconductor substrates. Device dies 36 may include memory dies such as Static Random Access Memory (SRAM) dies, Dynamic Random Access Memory (DRAM) dies, or the like.

Device dies 36 include conductive features such as metal pillars 40 at their top surfaces. Metal pillars 40 are electrically coupled to the integrated circuits inside device dies 36. In accordance with some exemplary embodiments of the present disclosure, as shown in FIG. 1, the top surfaces of metal pillars 40 are exposed. Metal pillars 40 may be copper pillars, and may also include other conductive/metallic materials such as aluminum, nickel, or the like. In accordance with some embodiments of the present disclosure, the top surfaces of metal pillars 40 are coplanar with the top surface of dielectric layer 42. In accordance with alternative embodiments of the present disclosure, metal pillars 40 are embedded in dielectric layer 42, with the top surfaces of dielectric layers 42 being higher than the top surfaces of metal pillars 40. Dielectric layer 42 may be formed of a polymer, which may include PBO, polyimide, or the like. Throughout the description, device dies 36 are also referred to as level-1 dies or lower-level dies.

Figure 2:
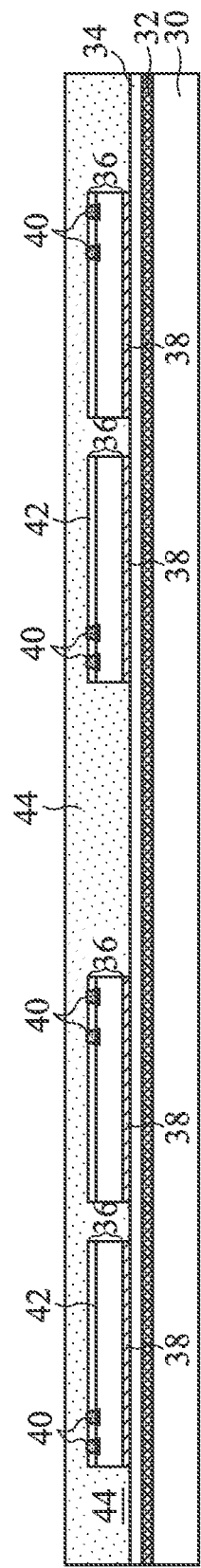

Referring to FIG. 2, molding material 44 is molded on device dies 36. The respective step is shown as step 204 in the process flow shown in FIG. 22. Throughout the description, the "molding material" is alternatively referred to as "encapsulating material," and the step of "molding" is alternatively referred to as "encapsulating." Molding material 44 is dispensed as a fluid and is then cured, for example, in a thermal curing process. Molding material 44 fills the gaps between device dies 36 and may be in contact with buffer layer 34. Molding material 44 may include a molding compound, a molding underfill, an epoxy, or a resin. After the molding process, the top surface of molding material 44 is higher than the top ends of metal pillars 40.

Figure 3:
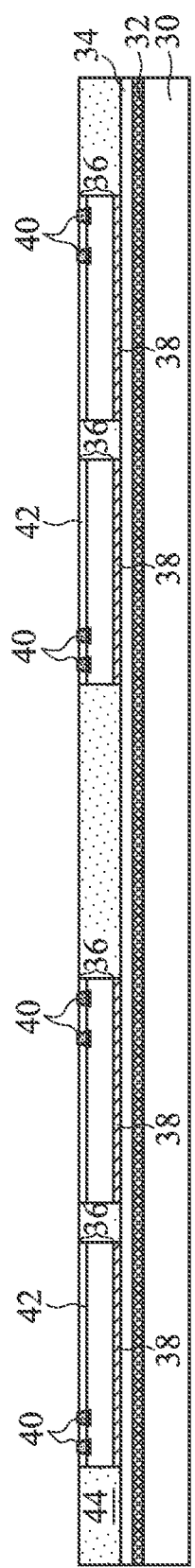

Next, a planarization step such as a Chemical Mechanical Polish (CMP) step or a grinding step is performed to planarize molding material 44, until metal pillars 40 of device dies 36 are exposed. The respective step is shown as step 206 in the process flow shown in FIG. 22. The resulting structure is shown in FIG. 3. Due to the planarization, the top surfaces of metal pillars 40 are substantially level (coplanar) with the top surface of molding material 44.

Figure 4:
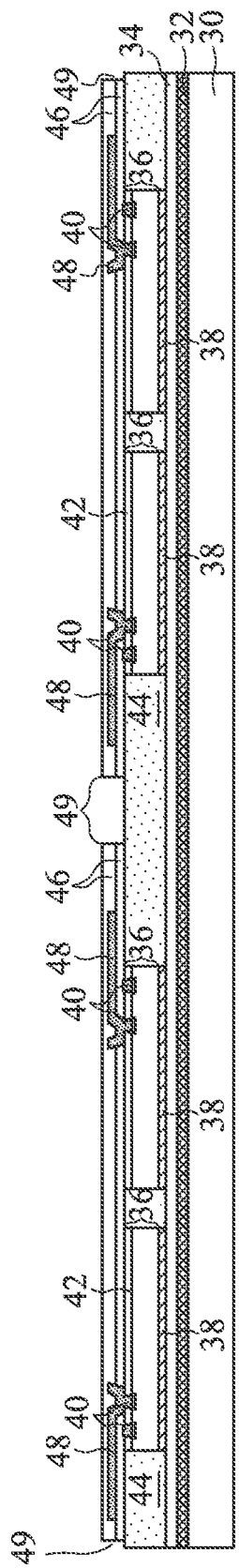

Referring to FIG. 4, one or more layers of dielectric layers 46 and the respective Redistribution Lines (RDLs) 48 are formed over molding material 44 and metal pillars 40. The respective step is shown as step 208 in the process flow shown in FIG. 22. In accordance with some embodiments of the present disclosure, dielectric layers 46 are formed of a polymer(s) such as PBO, polyimide, or the like. In accordance with alternative embodiments of the present disclosure, dielectric layers 46 are formed of an inorganic dielectric material(s) such as silicon nitride, silicon oxide, silicon oxynitride, or the like.

RDLs 48 are formed to electrically couple to metal pillars 40. RDLs 48 may include metal traces (metal lines) and vias underlying and connected to the respective metal traces. In accordance with some embodiments of the present disclosure, RDLs 48 are formed through plating processes, wherein each of RDLs 48 includes a seed layer (not shown) and a plated metallic material over the seed layer. The seed layer and the plated metallic material may be formed of the same material or different materials.

During the formation of RDLs 48, dielectric layers 46 are patterned to form via openings (occupied by RDLs 48), and upper-level RDLs 48 extend into the via openings to contact lower-level RDLs 48 or metal pillars 40. At the same time the via openings are formed, some portions of dielectric layers 46 are also removed to form openings 49 in dielectric layers 46. The formation of via openings and openings 49 may be performed using a same lithography mask and same lithography processes. Openings 49 may form a grid including horizontal openings (trenches, viewed from top) crossing vertical openings. The remaining portions of dielectric layers 46 are thus in the regions defined by the grid.

Figure 5:
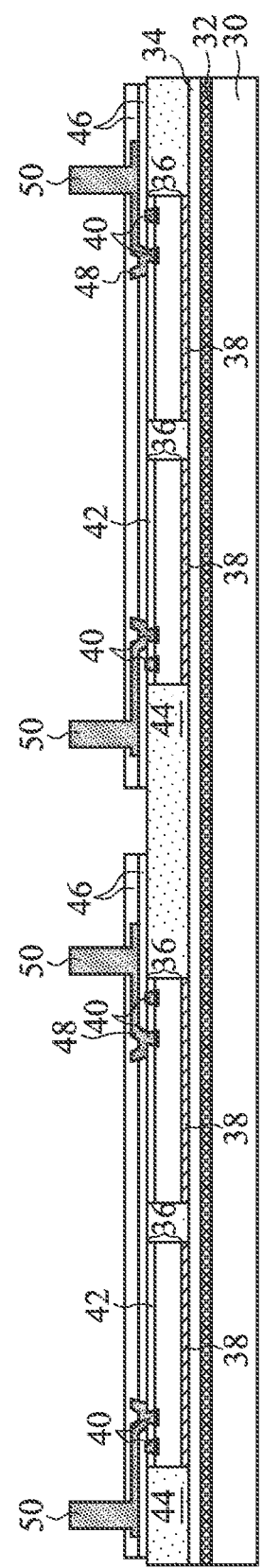

Referring to FIG. 5, metal posts 50 are formed over dielectric layers 46, and are electrically connected to RDLs 48. Throughout the description, metal posts 50 are alternatively referred to as through-vias 50 since metal posts 50 penetrate through the subsequently formed molding material. The respective step is shown as step 210 in the process flow shown in FIG. 22. Through-vias 50 are connected to RDLs 48 through the vias formed in the top layer of dielectric layers 46. In accordance with some embodiments of the present disclosure, through-vias 50 are formed by plating, and the formation process may include patterning the top layer of dielectric layers 46 to form openings to expose RDLs 48, forming a blanket seed layer (not shown) extending into the openings, forming and patterning a photo resist (not shown), and plating through-vias 50 on the portions of the seed layer that are exposed through the openings in the photo resist. The photo resist and the portions of the seed layer that were covered by the removed photo resist are then removed. The material of through-vias 50 may include copper, aluminum, nickel, tungsten, or the like. Through-vias 50 have the shape of rods. The top-view shapes of through-vias 50 may be circles, rectangles, squares, hexagons, or the like.

Figure 6:
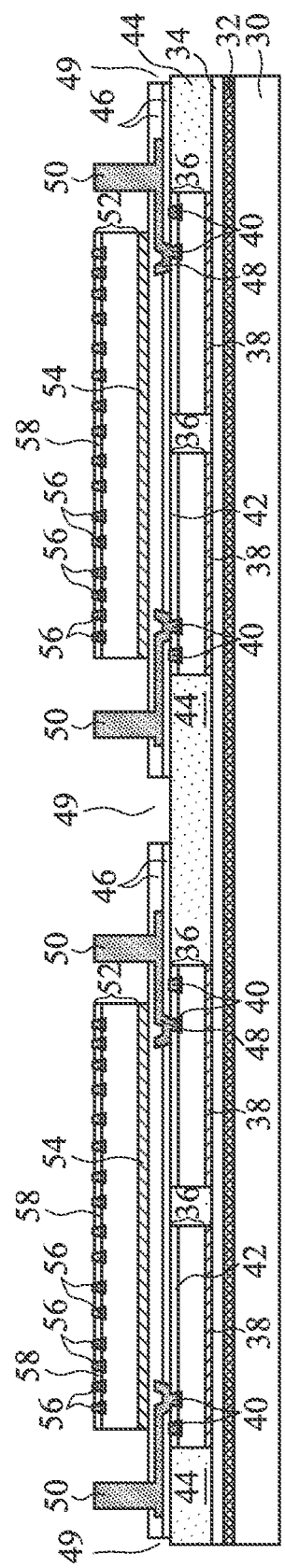

FIG. 6 illustrates the placement of device dies 52 over dielectric layers 46. Throughout the description, device dies 52 are also referred to as level-2 dies or upper-level dies. The respective step is shown as step 212 in the process flow shown in FIG. 22. Device dies 52 may be adhered to the top dielectric layer 46 through die attach films 54, which are adhesive films. Each of device dies 52 may include a semiconductor substrate having a back surface (the surface facing down) in physical contact with the respective die attach film 54. Device dies 52 further includes integrated circuit devices (such as active devices, which include transistors, for example, not shown) at the front surface (the surface facing up) of the semiconductor substrate. Device dies 52 may include logic dies such as Central Processing Unit (CPU) dies, Graphic Processing Unit (GPU) dies, mobile application dies, or the like. Device dies 52 may also include System on Chip (SoC) dies.

Device dies 52 include conductive features such as metal pillars 56 at their top surfaces. Metal pillars 56 are electrically coupled to the integrated circuits inside device dies 52. In accordance with some exemplary embodiments of the present disclosure, as shown in FIG. 6, the top surfaces of metal pillars 56 are exposed. Metal pillars 56 may be copper pillars, and may also include other conductive/metallic materials such as aluminum, nickel, or the like. In accordance with some embodiments of the present disclosure, the top surfaces of metal pillars 56 are coplanar with the top surface of dielectric layer 58. In accordance with alternative embodiments of the present disclosure, metal pillars 56 are embedded in dielectric layer 58, with the top surfaces of dielectric layers 58 being higher than the top surfaces of metal pillars 56. Dielectric layer 58 may be formed of a polymer, which may include PBO, polyimide, or the like.

Figure 7:
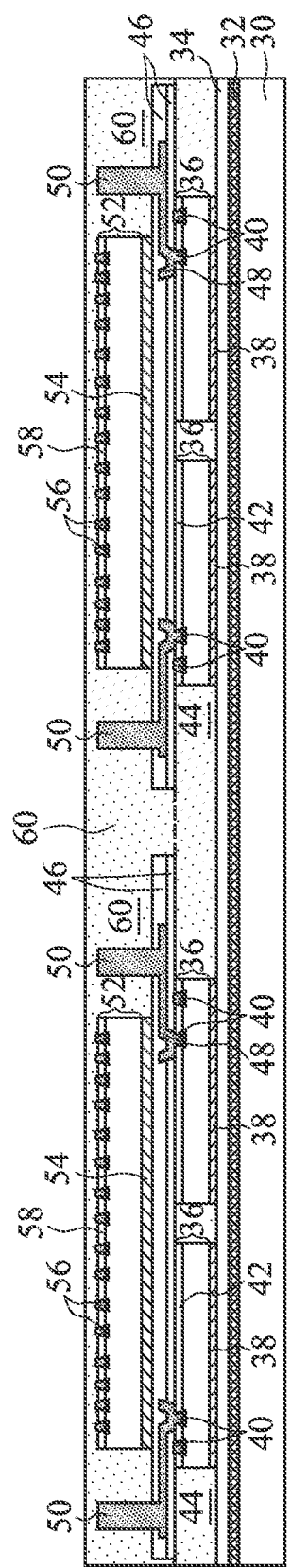

Referring to FIG. 7, molding material 60 is molded on device dies 52 and through-vias 50. The respective step is shown as step 214 in the process flow shown in FIG. 22. Molding material 60 may include a molding compound, a molding underfill, an epoxy, or a resin. After the molding process, the top surface of molding material 60 is higher than the top ends of metal pillars 56 and through-vias 50. Molding material 60 is filled into openings 49 (FIG. 6) to contact molding material 44. In accordance with some embodiments of the present disclosure, molding material 44 and molding material 60 are formed of a same type of molding material. In accordance with alternative embodiments, molding material 44 and molding material 60 are formed of different types of molding materials.

Figure 8:
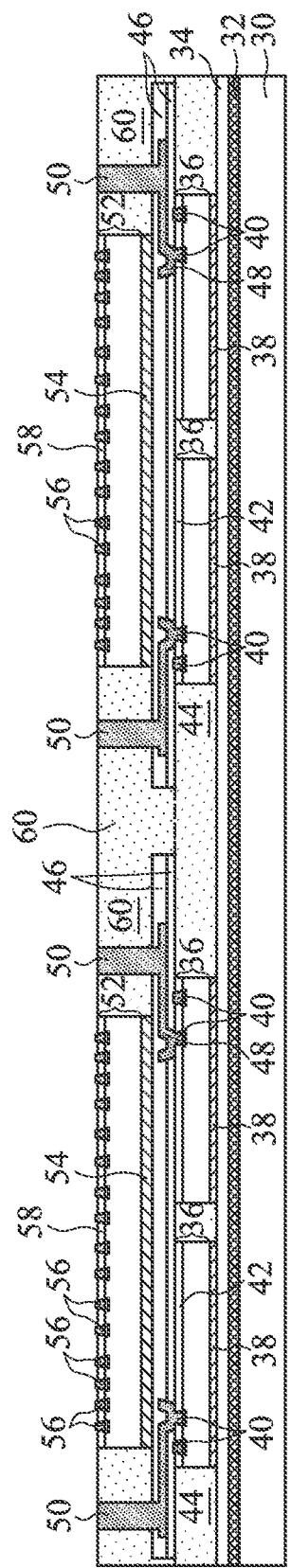

Next, a planarization step is performed to planarize molding material 60, until through-vias 50 are exposed. The respective step is shown as step 216 in the process flow shown in FIG. 22. The resulting structure is shown in FIG. 8. Metal pillars 56 of device dies 52 are also exposed as a result of the planarization. Due to the planarization, the top surfaces of through-vias 50 are substantially level (coplanar) with the top surfaces of metal pillars 56, and are substantially level (coplanar) with the top surface of molding material 60.

Figure 9:
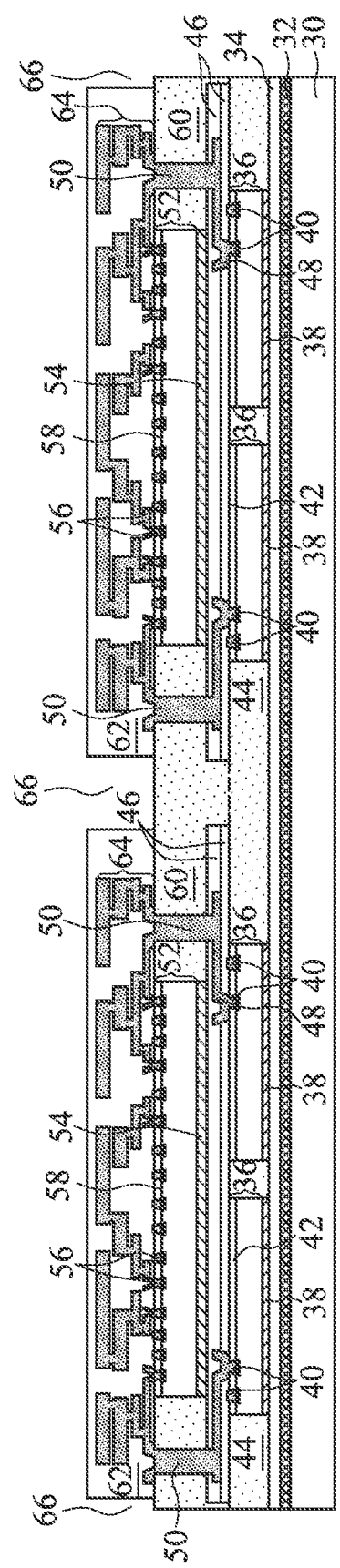

Referring to FIG. 9, one or more layers of dielectric layers 62 and the respective RDLs 64 are formed over molding material 60, through-vias 50, and metal pillars 56. The respective step is shown as step 218 in the process flow shown in FIG. 22. In accordance with some embodiments of the present disclosure, dielectric layers 62 are formed of a polymer(s) such as PBO, polyimide, or the like. In accordance with alternative embodiments of the present disclosure, dielectric layers 62 are formed of an inorganic dielectric material(s) such as silicon nitride, silicon oxide, silicon oxynitride, or the like.

RDLs 64 are formed to electrically couple to metal pillars 56 and through-vias 50. RDLs 64 may also electrically interconnect metal pillars 56, through-vias 50, and metal pillars 40 with each other. RDLs 64 may include metal traces (metal lines) and vias underlying and connected to the metal traces. In accordance with some embodiments of the present disclosure, RDLs 64 are formed through plating processes, wherein each of RDLs 64 includes a seed layer (not shown) and a plated metallic material over the seed layer. The seed layer and the plated metallic material may be formed of the same material or different materials.

During the formation of RDLs 64, dielectric layers 62 are also patterned to form via openings, and upper-level RDLs 64 extend into the via openings to contact lower-level RDLs 64 or metal pillars 56. At the same time the via openings are formed, some portions of dielectric layers 62 are also removed to form openings 66 in dielectric layers 62. The formation of via openings and openings 66 may be performed using a same lithography mask and same lithography processes. Openings 66 may form a grid, with the remaining portions of dielectric layers 62 being in the regions defined by the grid. Molding material 60 is thus exposed through openings 66.

Figure 10:
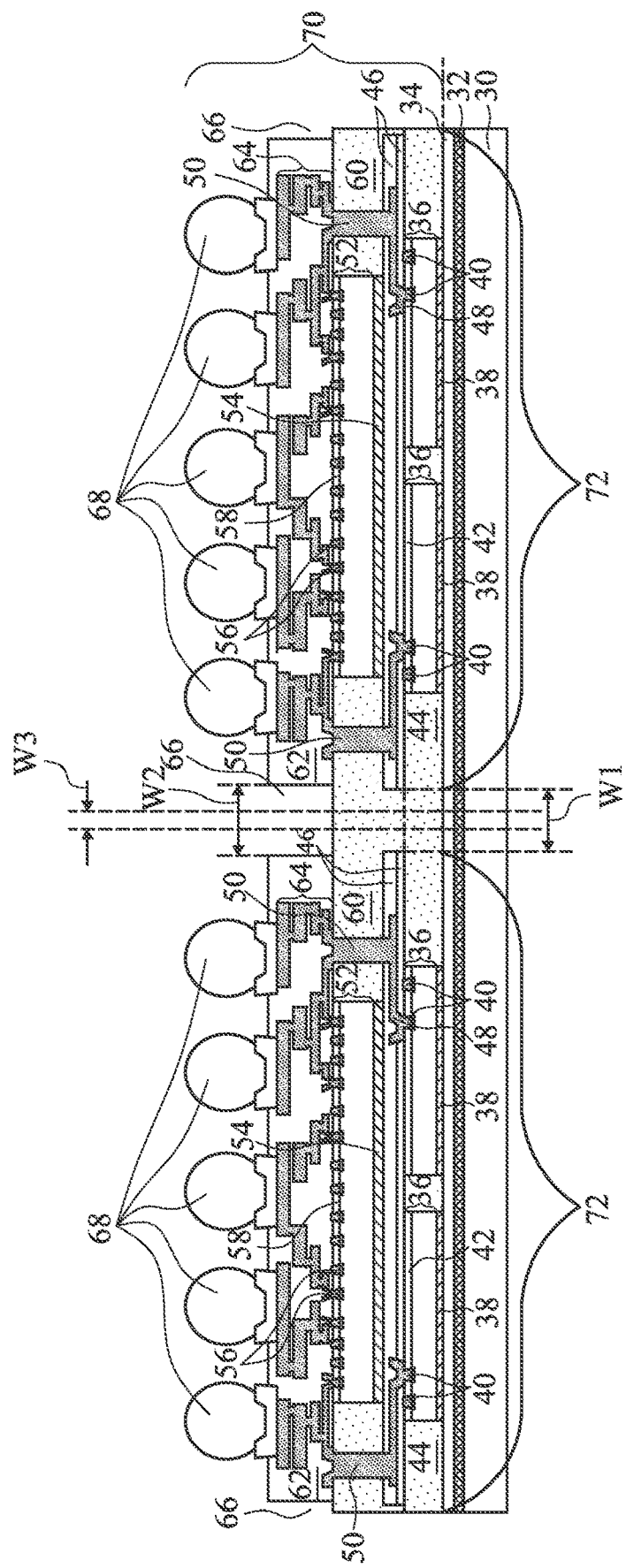

FIG. 10 illustrates the formation of electrical connectors 68 in accordance with some exemplary embodiments of the present disclosure. The respective step is shown as step 224 in the process flow shown in FIG. 22. Electrical connectors 68 are electrically coupled to RDLs 64, metal pillars 40 and 56, and/or through-vias 50. The formation of electrical connectors 68 may include placing solder balls over RDLs 64 and then reflowing the solder balls. In accordance with alternative embodiments of the present disclosure, the formation of electrical connectors 68 includes performing a plating step to form solder regions over RDLs 64 and then reflowing the solder regions. Electrical connectors 68 may also include metal pillars, or metal pillars and solder caps, which may also be formed through plating. Throughout the description, the combined structure including device dies 52, through-vias 50, molding material 60, RDLs 64, and dielectric layers 62 will be referred to as package 70, which is also a composite wafer.

In accordance with some embodiments of the present disclosure, width W1 of opening 49 (also refer to FIG. 4) is in the range between about 100 μm and about 300 μm. Width W2 of openings 66 is in the range between about 100 μm and about 300 μm. Width W2 may be greater than or equal to width W1. Width W3 of the saw-line is in the range between about 30 μm and about 40 μm.

Next, package 70 is de-bonded from carrier 30. In accordance with some exemplary de-boding process, a dicing tape (not shown) is attached to package 72 to protect electrical connectors 68. The de-bonding of package 70 from carrier 30 is performed, for example, by projecting a UV light or a laser on adhesive layer 32. For example, when adhesive layer 32 is formed of LTHC, the heat generated from the light or laser causes the LTHC to be decomposed, and hence carrier 30 is detached from package 72. In a subsequent step, die-saw is performed to saw package 70 into discrete packages 72. The respective step is also shown as step 224 in the process flow shown in FIG. 22.

Figure 11:
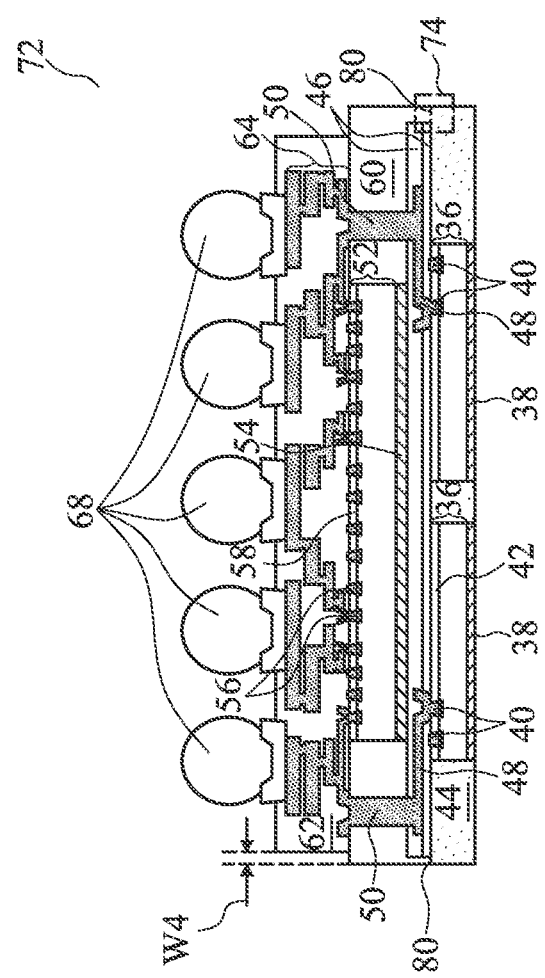

FIG. 11 illustrates a resulting discrete package 72. Package 72 includes device dies 36 at a lower level, and device dies 52 at an upper level. Device dies 36 and 52 are electrically interconnected through RDLs 48 and 64 and through-vias 50 to form a multi-stacking package 72. Dielectric layers 46, which may be polymer layers, are formed between lower-level die(s) 36 and upper-level dies 52. Lower-level dies 36 are molded in molding material 44, and upper-level dies 52 are molded in molding material 60. Molding material 60 extends down, with a portion of molding material 60 being coplanar with dielectric layers 46.

Figure 12:
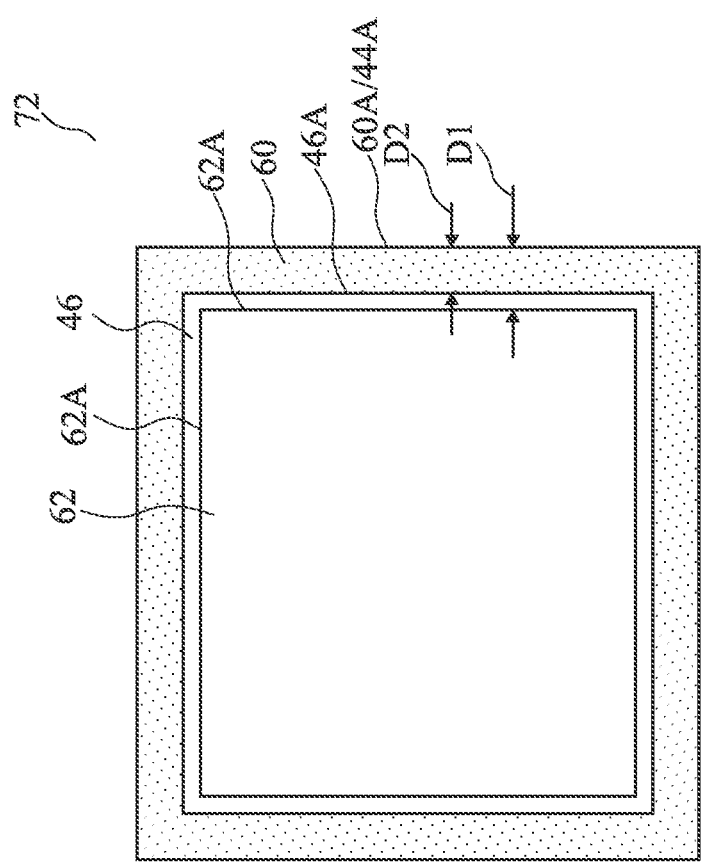
FIG. 12 illustrates a top view of a portion of the multi-stacking fan-out package.

FIG. 12 illustrates a top view of a portion of discrete package 72, wherein the top view is obtained at the level of dielectric layers 46. As shown in FIG. 12, a portion of molding material 60 (referred to as a ring portion hereinafter) encircles dielectric layers 46. Also, edges 62A of dielectric layers 62 are misaligned with the respective edges of molding materials 44 and 60, and are recessed more toward the center of package 72.

In accordance with some embodiments of the present disclosure, edge 62A of dielectric layers 62 is recessed from edge 60A of molding material 60 (and edge 44A of molding material 44) by recessing distance D1, which may be in the range between about 30 µm and about 130 µm. The width of the ring portion of molding material 60 is equal to recessing distance D2, which is the recessing distance of edge 46A of dielectric layers 46 recessed from edge 60A of molding material 60. Recessing distance D2 may also be in the range between about 30 µm and about 130 µm.

Figure 13:
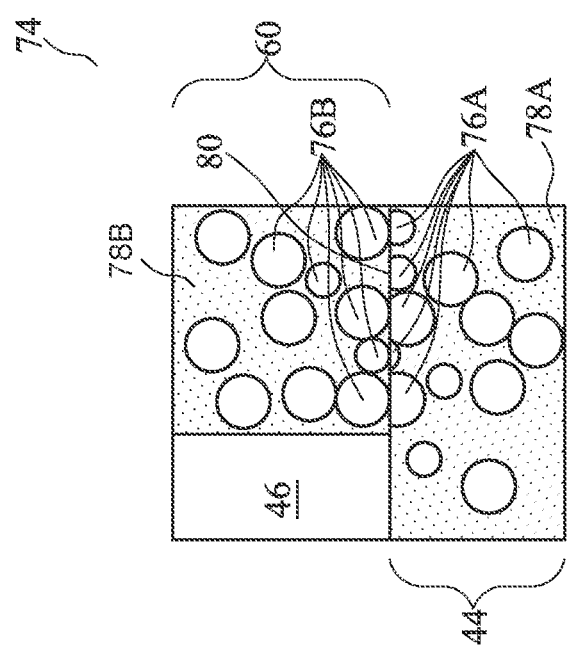
FIG. 13 illustrates a magnified view of a portion of a multi-stacking fan-out package in accordance with some embodiments.

Furthermore, the bottom surface of the ring portion of molding material 60 is coplanar with the bottom surface of dielectric layers 46, as shown in FIG. 11, and is in contact with the top surface of molding material 44 to form interface 80. Regardless of whether molding materials 44 and 60 are formed of a same material or different molding materials, interface 80 is distinguishable due to the planarization of molding material 44. For example, FIG. 13 illustrates a schematic magnified view of a portion of package 72 in region 74 (FIG. 11). Molding material 44 may include fillers 76A in polymer 78A. Molding material 60 may include fillers 76B in polymer 78B. Fillers 76A and 76B may be formed of silica, aluminum oxide, aluminum nitride, silicon carbide, or the like, and the material of fillers 76A may be the same or different from the material of fillers 76B. Furthermore, fillers 76A and 76B may have spherical shapes. Due to the planarization of molding material 44, fillers 76A are also grinded, and the top portions of some fillers 76A are removed. Accordingly, some top portions of fillers 76A may have planar top surfaces coplanar with interface 80, with these fillers 76A having round lower parts. On the other hand, some fillers 76B that contact interface 80 have rounded bottom ends coplanar with interface 80. Accordingly, interface 80 is distinguishable through the shapes of fillers 76A and 76B.

Figure 14:
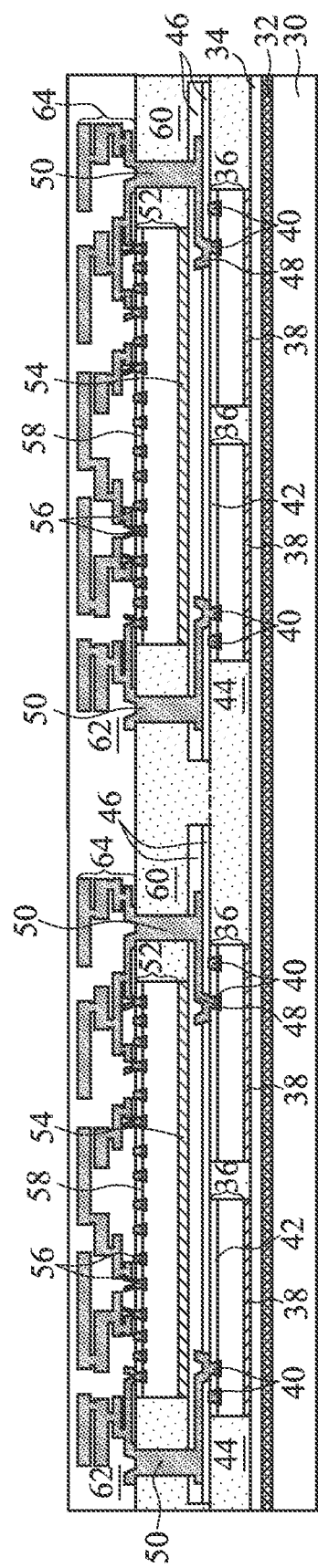
FIGS. 14 through 16 illustrate the cross-sectional views of intermediate stages in the formation of a multi-stacking fan-out package in accordance with alternative embodiments, wherein no opening is formed in upper polymer layers.
Figure 15:
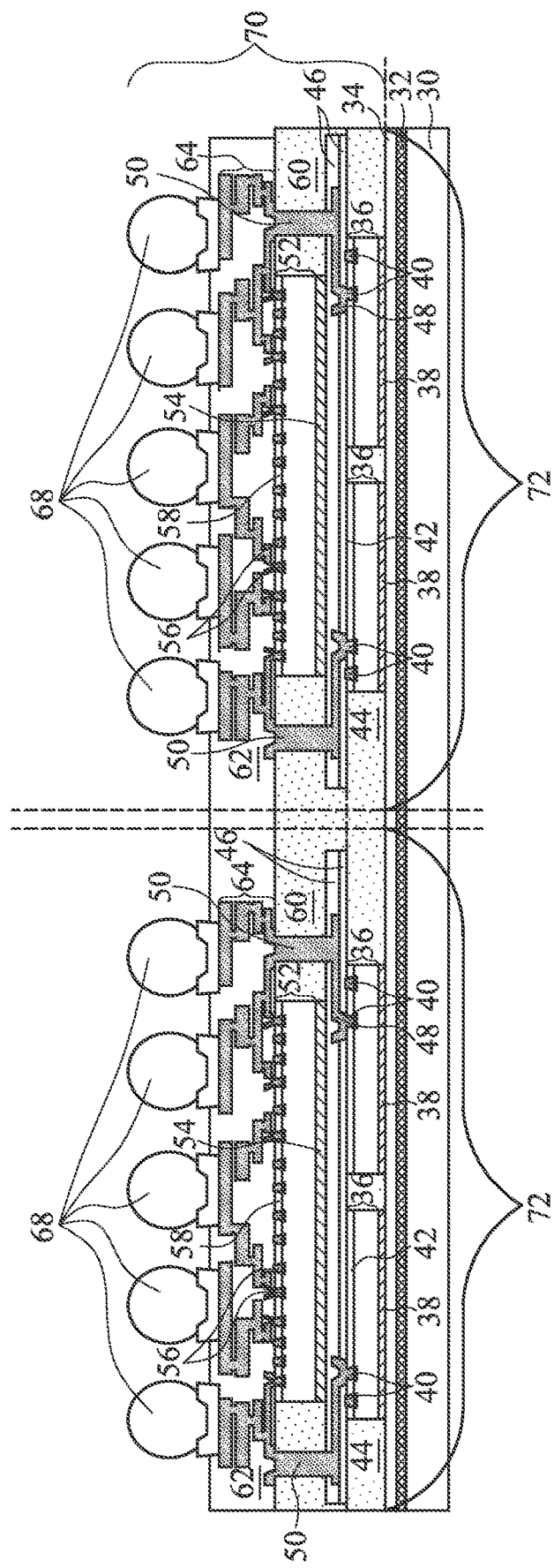
Figure 16:
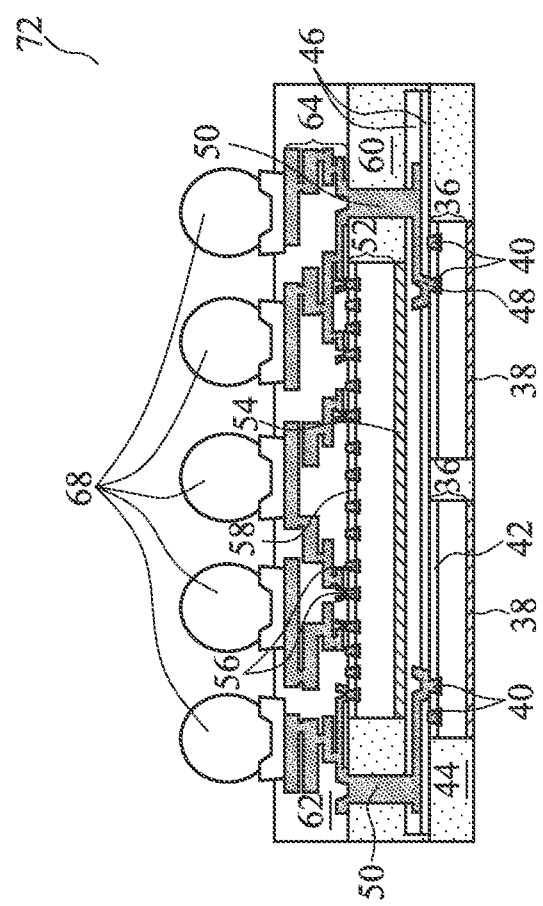

FIGS. 14 through 16 illustrate the cross-sectional views of intermediate stages in the formation of a multi-stacking package in accordance with alternative embodiments of the present disclosure. Unless specified otherwise, the materials and the formation methods of the components in these embodiments are essentially the same as the like components, which are denoted by like reference numerals in the embodiments shown in FIGS. 1 through 13. The details regarding the formation process and the materials of the components shown in FIGS. 14 through 16 (and also FIGS. 17 through 21) may thus be found in the discussion of the embodiments shown in FIGS. 1 through 13.

The initial steps of these embodiments are essentially the same as shown in FIGS. 1 through 8. Next, as shown in FIG. 14, dielectric layers 62 and RDLs 64 are formed. The formation process is similar to the process in FIG. 9, except that when via openings are formed in dielectric layers 62, no openings are formed between device dies 52. Alternatively stated, openings 66 as shown in FIG. 9 are not formed in accordance with these embodiments. Next, as shown in FIG. 15, electrical connectors 68 are formed, and a die-saw is performed to separate package 70 into packages 72. A resulting discrete package 72 is shown in FIG. 16. The package 72 in FIG. 16 is similar to the package 72 shown in FIG. 11, except that the edges of dielectric layers 62 are vertically aligned to (co-terminus with and it the same vertical plane as) the respective edges of molding materials 44 and 60.

Figure 17:
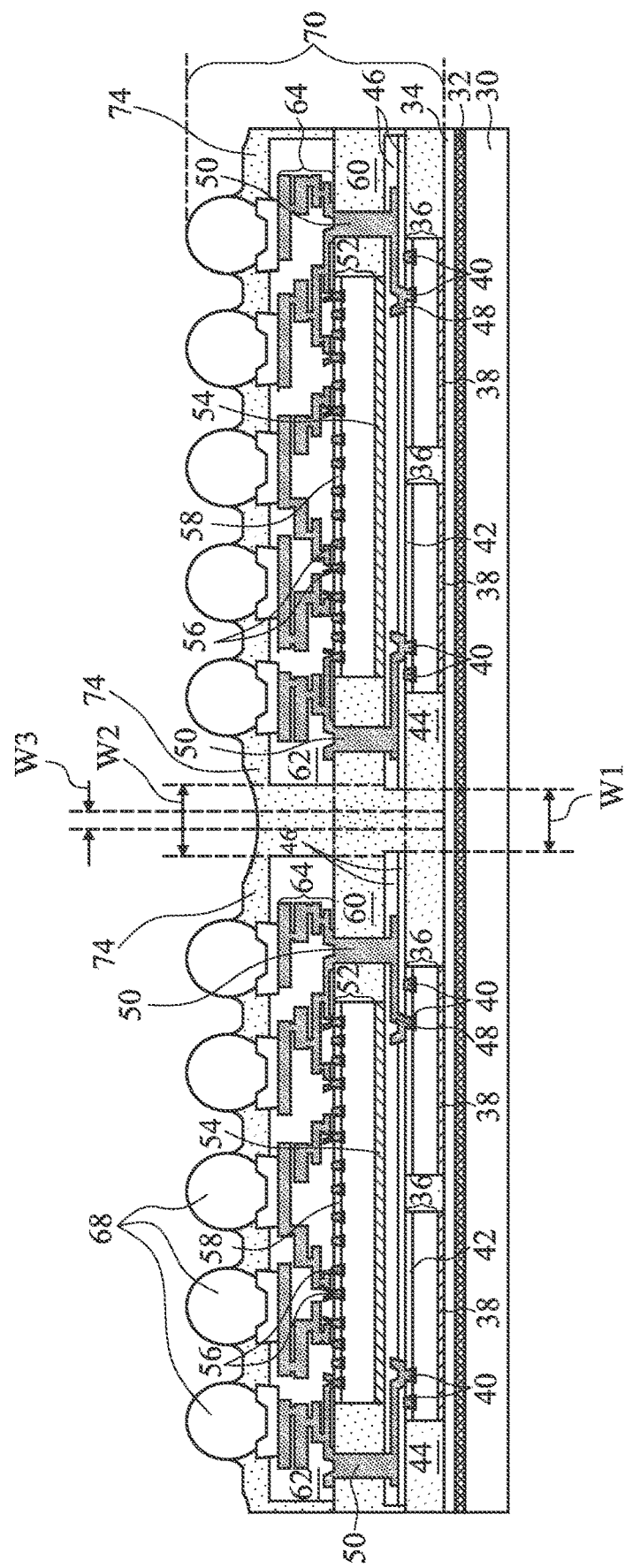
FIGS. 17 and 18 illustrate the cross-sectional views of intermediate stages in the formation of a multi-stacking fan-out package in accordance with alternative embodiments, wherein a liquid molding compound is applied.
Figure 18:
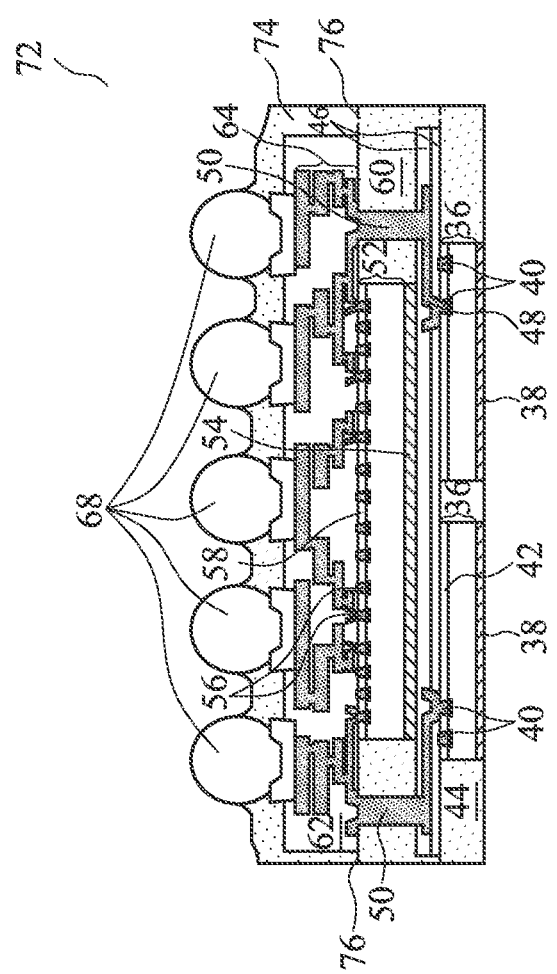

FIGS. 17 and 18 illustrate the cross-sectional views of intermediate stages in the formation of a multi-stacking package in accordance with yet alternative embodiments of the present disclosure. The initial steps of these embodiments are essentially the same as shown in FIGS. 1 through 9. Next, as shown in FIG. 17, liquid molding compound 74 is applied to protect package 70, wherein the lower parts of electrical connectors 68 are molded in liquid molding compound 74. The respective step is shown as step 222 in the process flow shown in FIG. 22, wherein the dashed box indicates step 222 may be performed or skipped in different embodiments. The molding process includes applying liquid molding compound 74, and pressing liquid molding compound 74 using a release film (not shown), so that the top parts of electrical connectors 68 are pressed into the release film, and the excess liquid molding compound 74 is squeezed away from package 72 by the release film. Liquid molding compound 74 is then cured. The release film is then removed, leaving the structure in FIG. 17. The cured liquid molding compound 74 is referred to as molding material 74 hereinafter. Molding materials 60 and 74 may be formed of a same molding material, or may be formed of different molding materials.

Package 70 is then de-bonded from carrier 30, and is sawed. The resulting discrete package 72 is shown in FIG. 18. In package 72, in addition to the ring portion (a full ring) of molding material 60 that encircles dielectric layers 46, molding material 74 also has a ring portion (a full ring) encircling dielectric layers 62. The bottom surface of molding material 74 contacts the top surface of molding material 60 to form interface 76. Interface 76 is distinguishable since molding material 60 is grinded or polished, and hence the fillers in molding material 60 will also be polished to have planar top surfaces coplanar with interface 76. The distinguishable features of interface 76 are similar to what is shown in FIG. 13.

Figure 19:
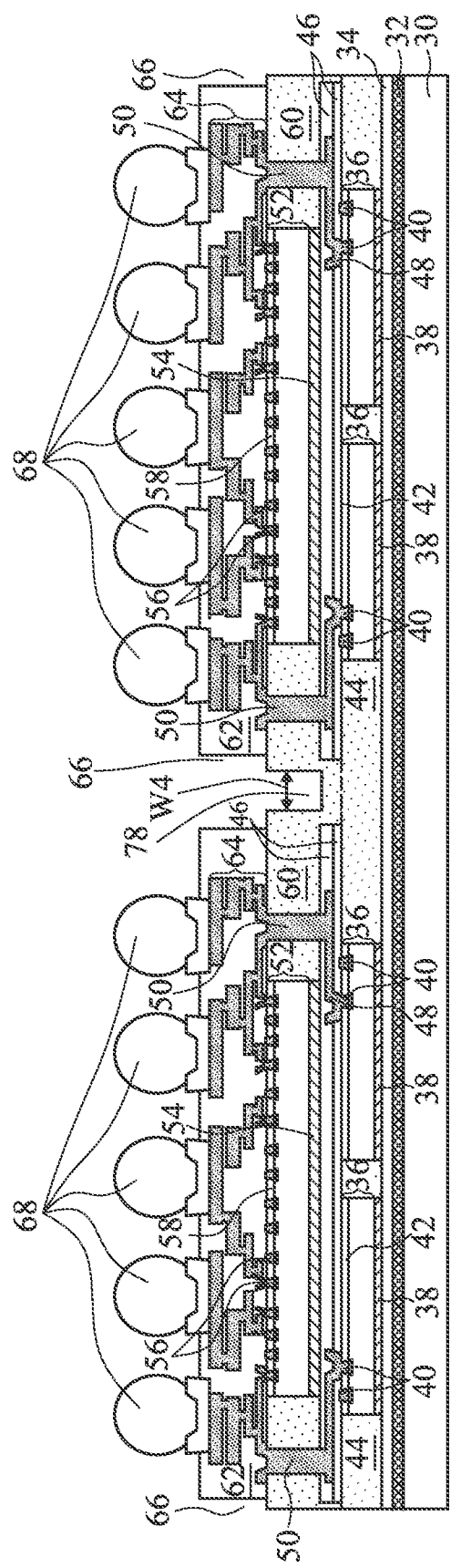
FIGS. 19 through 21 illustrate the cross-sectional views of intermediate stages in the formation of a multi-stacking fan-out package in accordance with alternative embodiments, wherein a partial cut is performed prior to applying a liquid molding compound.
Figure 20:
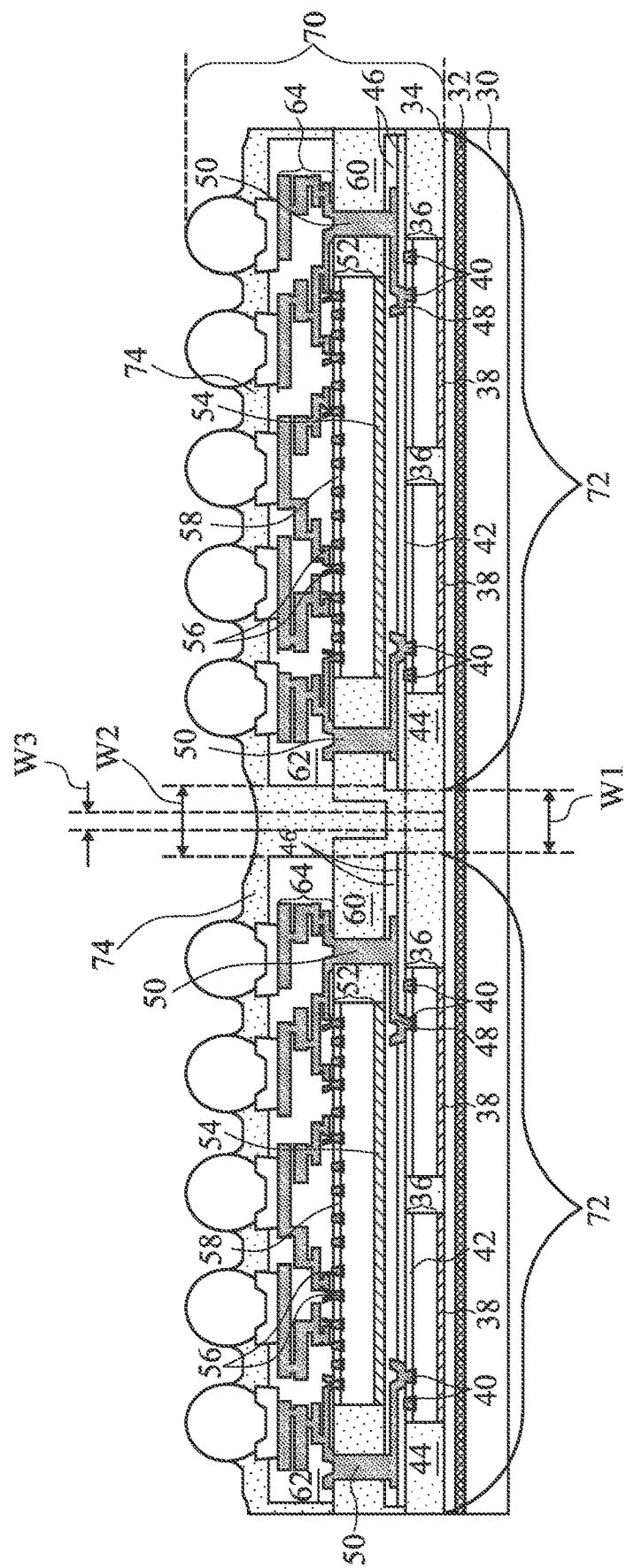
Figure 21:
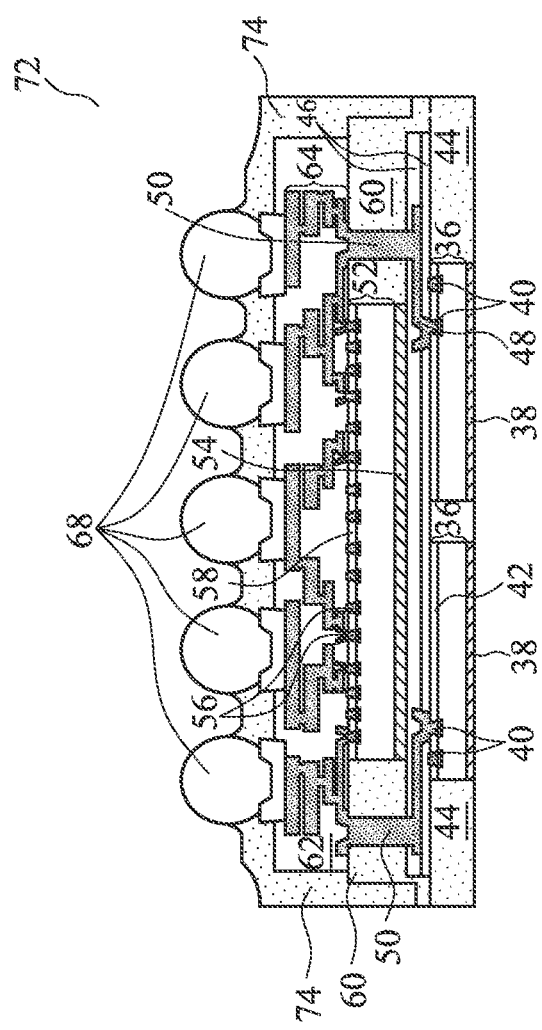

FIGS. 19 through 21 illustrate the cross-sectional views of intermediate stages in the formation of a multi-stacking package in accordance with alternative embodiments of the present disclosure. The initial steps of these embodiments are essentially the same as shown in FIGS. 1 through 9. Next, as shown in FIG. 19, a partial cut is performed to cut (for example, through sawing) into molding material 60, and hence forming trench 78 in molding material 60. The respective step is shown as step 220 in the process flow shown in FIG. 22. Trench 78 may be aligned to the center of the respective overlaying trench 66. The bottom of trench 78 may be at an intermediate level between the top surface of the top dielectric layer 46 and the bottom surface of the bottom dielectric layer 46. In accordance with some exemplary embodiments, width W4 of trench 78 is in the range between about 50 µm and about 80 µm. The depth of trench 78 may be in the range between about 50 µm and about 80 µm. Again, trenches 78 may form a grid, with dielectric layers 46 in the grid openings defined by the grid.

FIG. 20 illustrates the formation of molding material 74, for example, through applying and curing a liquid molding compound. Molding material 74 fills trench 78 (FIG. 19) and contacts the sidewalls and the top surface of molding material 60.

Package 70 is then de-bonded from carrier 30, and is sawed. The resulting package 72 sawed from package 70 is shown in FIG. 21. In the package 72 according to these embodiments, the portions of molding material 74 filled into trenches 78 (FIG. 19) form a ring encircling portions of molding material 60. Furthermore, molding material 74 also has a ring portion encircling dielectric layers 62 and at least some top portions of dielectric layers 46.

The embodiments of the present disclosure have some advantageous features. By patterning the polymer layers between lower-level dies and upper-level dies, the polymer layers are separated into discrete portions during the manufacturing process, and hence the stress caused to package by the polymer layers is reduced. The space that will otherwise be occupied by the polymer layers are hence occupied by molding compound, which includes fillers, and hence have a smaller effect in causing warpage in the package than large polymer areas.

In accordance with some embodiments of the present disclosure, a package includes a first molding material, a lower-level device die in the first molding material, a dielectric layer over the lower-level device die and the first molding material, and a plurality of redistribution lines extending into the first dielectric layer to electrically couple to the lower-level device die. The package further includes an upper-level device die over the dielectric layer, and a second molding material molding the upper-level device die therein. A bottom surface of a portion of the second molding material contacts a top surface of the first molding material.

In accordance with alternative embodiments of the present disclosure, a package includes a first molding material, a lower-level device die in the first molding material, a first polymer layer over the lower-level device die and the first molding material, and a first plurality of redistribution lines extending into the first polymer layer to electrically couple to the lower-level device die. An upper-level device die is disposed over the first polymer layer. A second molding material molds the upper-level device die therein, wherein a first edge of the first molding material and a second edge of the second molding material are in a same plane to form an edge of the package. A portion of the second molding material includes the second edge and a third edge opposite to each other, with the third edge contacting the first polymer layer. A through-via is disposed in the second molding material, wherein the through-via and one of the first plurality of redistribution lines electrically couple the lower-level device die to the upper-level device die.

In accordance with alternative embodiments of the present disclosure, a method includes molding a lower-level device die in a first molding material, planarizing the first molding material to expose the lower-level device die, forming a first polymer layer over the first molding material, patterning the first polymer layer to form a first trench, placing an upper-level device die over the first polymer layer, and molding the upper-level device die in a second molding material, wherein the second molding material fills the first trench to contact the first molding material. The second molding material is planarized to expose the upper-level device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first first-level device die and a second first-level device die;
   a first encapsulant encapsulating the first first-level device die and the second first-level device die therein;
   a first build-up structure over and electrically connecting to the first first-level device die, wherein the first build-up structure comprises a first conductive pad;
   a second build-up structure over and electrically connecting to the second first-level device die, wherein the second build-up structure comprises a second conductive pad;
   a first conductive post over and contacting the first conductive pad;
   a second conductive post over and contacting the second conductive pad;
   a second-level device die over and attached to the first build-up structure and the second build-up structure; and
   a redistribution structure over and electrically connected to the first conductive post, the second conductive post, and the second-level device die.

2. The package of claim 1, wherein the first build-up structure comprises a first dielectric layer, with the first conductive pad being in the first dielectric layer, and the second build-up structure comprises a second dielectric layer, with the second conductive pad being in the second dielectric layer, and wherein the first dielectric layer and the second dielectric layer are separated from each other by an additional dielectric material.

3. The package of claim 1, wherein the first first-level device die comprises:
   a first portion overlapped by the second-level device die; and
   a second portion extending beyond a corresponding edge of the second-level device die.

4. The package of claim 1, wherein the first encapsulant comprises an intermediate portion between and contacting the first first-level device die and the second first-level device die, and wherein the second-level device die overlaps the intermediate portion.

5. The package of claim 1, wherein the second-level device die has a front side facing the redistribution structure.

6. The package of claim 1, wherein the first first-level device die and the second first-level device die comprise front sides facing the second-level device die.

7. The package of claim 1, wherein a first top surface of the second-level device die is coplanar with second top surfaces of the first conductive post and the second conductive post.

8. The package of claim 1, wherein the first conductive post and the second conductive post are copper posts.

9. A package comprising:
   a first device die and a second device die;
   a first conductive post over and connected to the first device die;

a second conductive post over and connected to the second device die;
a third device die overlapping a first portion of the first device die and a first portion of the second device die, wherein the third device die is between the first conductive post and the second conductive post;
a first molding compound molding the third device die, the first conductive post, and the second conductive post therein; and
an interconnect structure over and contacting the third device die, the first conductive post, and the second conductive post.

10. The package of claim 9, wherein each of the first device die and the second device die further comprises a second portion extending laterally beyond corresponding edges of the third device die.

11. The package of claim 9 further comprising a second molding compound molding both of the first device die and the second device die therein.

12. The package of claim 11, wherein the second molding compound is in physical contact with the first molding compound.

13. The package of claim 11, wherein the second molding compound comprises:
a base material; and
partial particles in the base material, wherein the partial particles comprise rounded surfaces contacting the base material, and planar surfaces contacting the first molding compound.

14. The package of claim 9 further comprising:
a first build-up structure over and electrically connecting to the first device die, wherein the first build-up structure comprises a first dielectric layer and a first conductive pad in the first dielectric layer, wherein the first conductive post is in physical contact with the first build-up structure; and
a second build-up structure over and electrically connecting to the second device die, wherein the second build-up structure comprises a second dielectric layer and a second conductive pad in the second dielectric layer, wherein the second conductive post is in physical contact with the second build-up structure.

15. The package of claim 14, wherein the first conductive post comprises a bottom surface in physical contact with a top surface of the first conductive pad.

16. The package of claim 9, wherein both of the first conductive post and the second conductive post comprise straight edges penetrating through the first molding compound.

17. A package comprising:
a first device die and a second device die;
a first build-up structure over and electrically connecting to the first device die, wherein the first build-up structure comprises a first dielectric layer and a first conductive pad in the first dielectric layer;
a second build-up structure over and electrically connecting to the second device die, wherein the second build-up structure comprises a second dielectric layer and a second conductive pad in the second dielectric layer;
a molding compound, wherein edges of the first build-up structure and the second build-up structure are in contact with additional edges of the molding compound to form vertical interfaces;
a third device die over and attached to the first build-up structure and the second build-up structure;
through-vias on opposing sides of the third device die; and
a redistribution structure over and electrically connecting to the through-vias and the third device die.

18. The package of claim 17, wherein the through-vias comprise copper.

19. The package of claim 17, wherein the first dielectric layer and the second dielectric layer comprise polymers.

20. The package of claim 17, wherein a combined region comprising the first device die and the second device die extends laterally beyond the third device die in opposite directions.

* * * * *